(12) United States Patent
Saitoh et al.

(10) Patent No.: US 11,508,798 B2
(45) Date of Patent: Nov. 22, 2022

(54) DISPLAY DEVICE HAVING CIRCULAR, OVAL, POLYGONAL FRAME WITH OPENING IN BENDING PORTION

(71) Applicant: SHARP KABUSHIKI KAISHA, Sakai (JP)

(72) Inventors: Takao Saitoh, Sakai (JP); Seiji Kaneko, Sakai (JP); Yohsuke Kanzaki, Sakai (JP); Masahiko Miwa, Sakai (JP); Masaki Yamanaka, Sakai (JP); Yi Sun, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 145 days.

(21) Appl. No.: 16/980,149

(22) PCT Filed: Mar. 12, 2018

(86) PCT No.: PCT/JP2018/009559
§ 371 (c)(1),
(2) Date: Sep. 11, 2020

(87) PCT Pub. No.: WO2019/175943
PCT Pub. Date: Sep. 19, 2019

(65) Prior Publication Data
US 2021/0020728 A1 Jan. 21, 2021

(51) Int. Cl.
*H01L 27/32* (2006.01)
*H01L 51/52* (2006.01)

(52) U.S. Cl.
CPC ...... *H01L 27/3276* (2013.01); *H01L 27/3246* (2013.01); *H01L 27/3258* (2013.01); *H01L 51/5253* (2013.01)

(58) Field of Classification Search
CPC ............. H01L 27/3276; H01L 27/3246; H01L 27/3258; H01L 51/5253
See application file for complete search history.

(56) References Cited

U.S. PATENT DOCUMENTS

| 3,696,608 | A | * | 10/1972 | Miyashita | ............ | G04B 37/086 368/292 |
| D313,187 | S | * | 12/1990 | Muller | ................ | H01L 51/0097 D10/39 |
| 2009/0102758 | A1 | * | 4/2009 | Anzai | ................... | G09G 3/2096 345/76 |
| 2010/0320909 | A1 | | 12/2010 | Izumi | | |
| 2014/0217373 | A1 | * | 8/2014 | Youn | ................... | H01L 51/5203 438/23 |
| 2016/0066409 | A1 | * | 3/2016 | Kwon | ................... | H01L 23/564 174/254 |

(Continued)

FOREIGN PATENT DOCUMENTS

JP 2011-008969 A 1/2011

*Primary Examiner* — Lex H Malsawma
(74) *Attorney, Agent, or Firm* — ScienBiziP, P.C.

(57) ABSTRACT

In an organic electroluminescence (EL) display device, a display region and a first frame region are defined in a substantially circular shape or a substantially oval shape, and in a bending portion, an opening is formed in an inorganic layered film, and a frame flattening film is provided to fill the opening. An end portion of the opening on the display region side is formed along an arc of the first frame region on the bending portion side.

19 Claims, 13 Drawing Sheets

(56) References Cited

U.S. PATENT DOCUMENTS

| | | | | |
|---|---|---|---|---|
| 2016/0113106 A1* | 4/2016 | Kim | ................ | H05K 1/028 |
| | | | | 361/679.01 |
| 2016/0161781 A1* | 6/2016 | Chiu | ................ | G02F 1/1333 |
| | | | | 349/158 |
| 2016/0179229 A1* | 6/2016 | Ahn | ................ | G06F 3/0447 |
| | | | | 345/173 |
| 2016/0351107 A1* | 12/2016 | Chen | ................ | G02F 1/1345 |
| 2017/0309644 A1* | 10/2017 | Yeh | ................ | G02F 1/1362 |
| 2017/0365650 A1* | 12/2017 | Kwon | ................ | H01L 51/0097 |
| 2018/0061917 A1* | 3/2018 | Kim | ................ | H01L 51/0097 |
| 2018/0090701 A1* | 3/2018 | Senda | ................ | H01L 51/5253 |

\* cited by examiner

DISPLAY DEVICE HAVING CIRCULAR, OVAL, POLYGONAL FRAME WITH OPENING IN BENDING PORTION

TECHNICAL FIELD

The disclosure relates to a display device.

BACKGROUND ART

In recent years, self-luminous organic electroluminescence (EL) display devices using organic EL elements have attracted attention as display devices that can replace liquid crystal display devices. As such an organic EL display device, a flexible organic EL display device produced by forming organic EL elements or the like on a resin substrate having flexibility has been proposed.

Here, because general organic EL display devices are required to have a rectangular display region for displaying an image and a frame region formed around the display region, and the frame region is required to be reduced in size, a method for reducing the frame region by, for example, bending the frame region on a terminal side has been proposed for flexible organic EL display devices.

For example, there is disclosed a flexible organic EL display device including, in a bending portion provided in a frame region on a terminal side, a resin substrate layer, an inorganic film and a flattening film provided on a surface of the resin substrate layer, and frame wiring lines provided on a surface of the flattening film (for example, see PTL 1).

CITATION LIST

Patent Literature

PTL 1: JP 2011-8969A

SUMMARY

Technical Problem

Here, in a general flexible organic EL display device, a portion of an inorganic film is removed at a bending portion. In a case where a shape of a display region for displaying images is substantially circular, substantially oval, or polygonal, a load applied to the inorganic film located near the bending portion is not uniform during bending. Thus, there is a problem that cracks may occur in the inorganic film provided between the bending portion and the display region.

Thus, taking the aforementioned problem into account, an object of the disclosure is to provide a display device that can prevent the occurrence of cracks in an inorganic film caused by bending in a case in which a shape of a display region is substantially circular, substantially oval, or polygonal.

Solution to Problem

To fulfill the object, a first display device according to the disclosure is a display device including a resin substrate; a thin film transistor (TFT) layer provided on the resin substrate and including a flattening film; a light-emitting element provided via the TFT layer to constitute a display region; a first frame region provided around the display region; a second frame region provided adjacent to the first frame region; a terminal portion provided at an end portion of the second frame region; a bending portion provided between the display region and the terminal portion in the second frame region; a plurality of frame wiring lines that are provided in the second frame region, connected to a wiring line of the display region, and extend to the terminal portion; and an at least one-layer inorganic film provided in the second frame region to constitute the TFT layer layered on the resin substrate, in which the display region and the first frame region are defined in a substantially circular shape or a substantially oval shape, in the bending portion, an opening is formed in the inorganic film and a frame flattening film is provided to fill the opening, and an end portion of the opening on the display region side is formed along an arc of the first frame region on the bending portion side.

In addition, a second display device according to the disclosure is a display device including a resin substrate; a TFT layer provided on the resin substrate and including a flattening film; a light-emitting element provided via the TFT layer to constitute a display region; a first frame region provided around the display region; a second frame region provided adjacent to the first frame region; a terminal portion provided at an end portion of the second frame region; a bending portion provided between the display region and the terminal portion in the second frame region; a plurality of frame wiring lines that are provided in the second frame region, are connected to a wiring line of the display region, and extend to the terminal portion; and an at least one-layer inorganic film provided in the second frame region to constitute the TFT layer layered on the resin substrate, in which the display region and the first frame region are defined in a polygonal shape, a distance between an end portion of the first frame region on the bending portion side and the bending portion in a longitudinal direction of the display device varies in a short-hand direction of the display device, in the bending portion, an opening is formed in the inorganic film and a frame flattening film is provided to fill the opening, and an end portion of the opening on the display region side is formed along an end portion of the first frame region on the bending portion side.

Advantageous Effects of Disclosure

According to the disclosure, in a case in which a shape of a display region is substantially circular, substantially oval, or polygonal, the occurrence of cracks in an inorganic film caused by bending can be prevented.

DESCRIPTION OF EMBODIMENTS

Embodiments of the disclosure will be described below in detail with reference to the drawings. Note that the disclosure is not limited to the embodiments which will be described below.

First Embodiment

Figure 1:
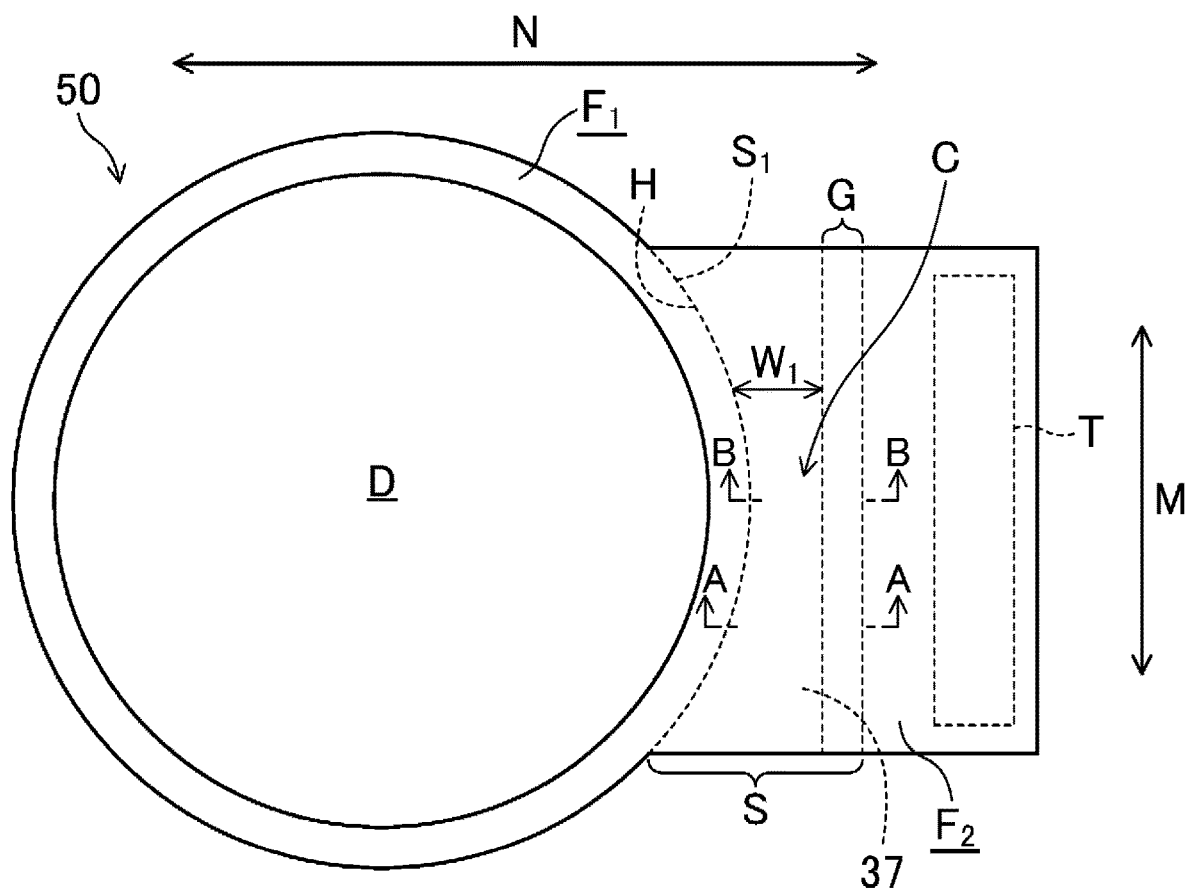
FIG. 1 is a plan view of an organic EL display device according to a first embodiment.
Figure 2:
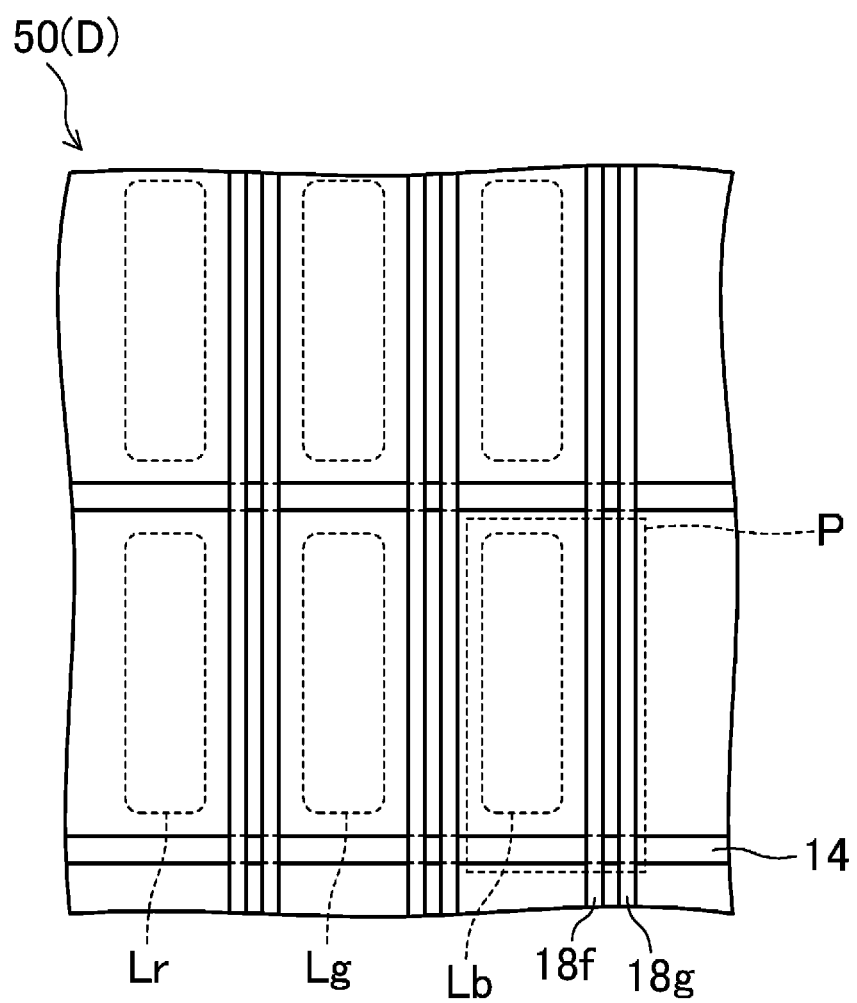
FIG. 2 is a plan view of a display region of the organic EL display device according to the first embodiment.
Figure 3:
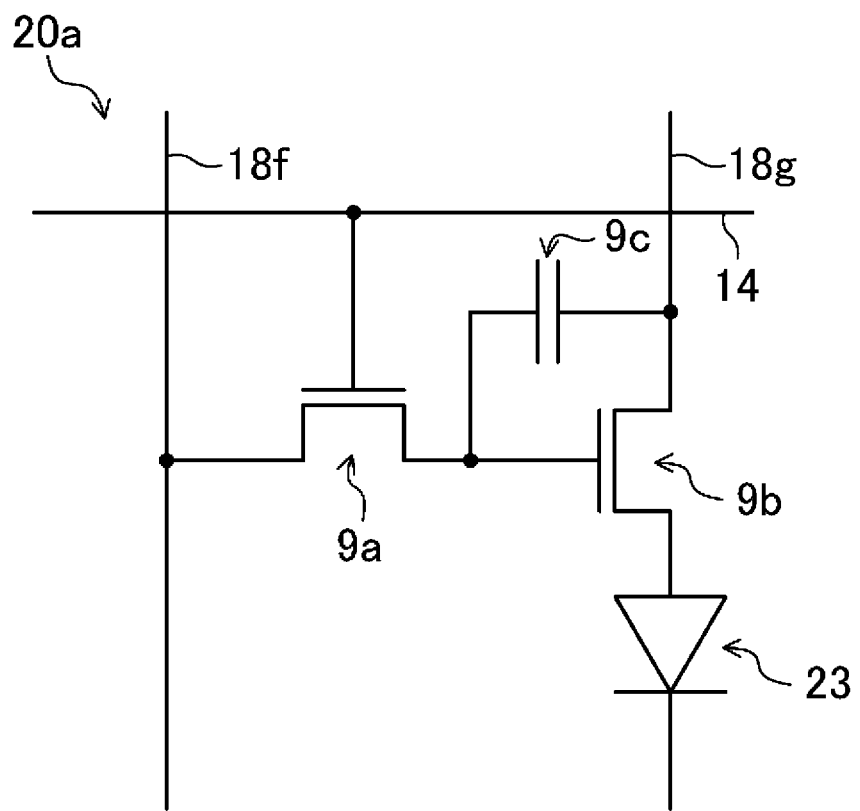
FIG. 3 is an equivalent circuit diagram illustrating a TFT layer constituting the organic EL display device according to the first embodiment.
Figure 4:
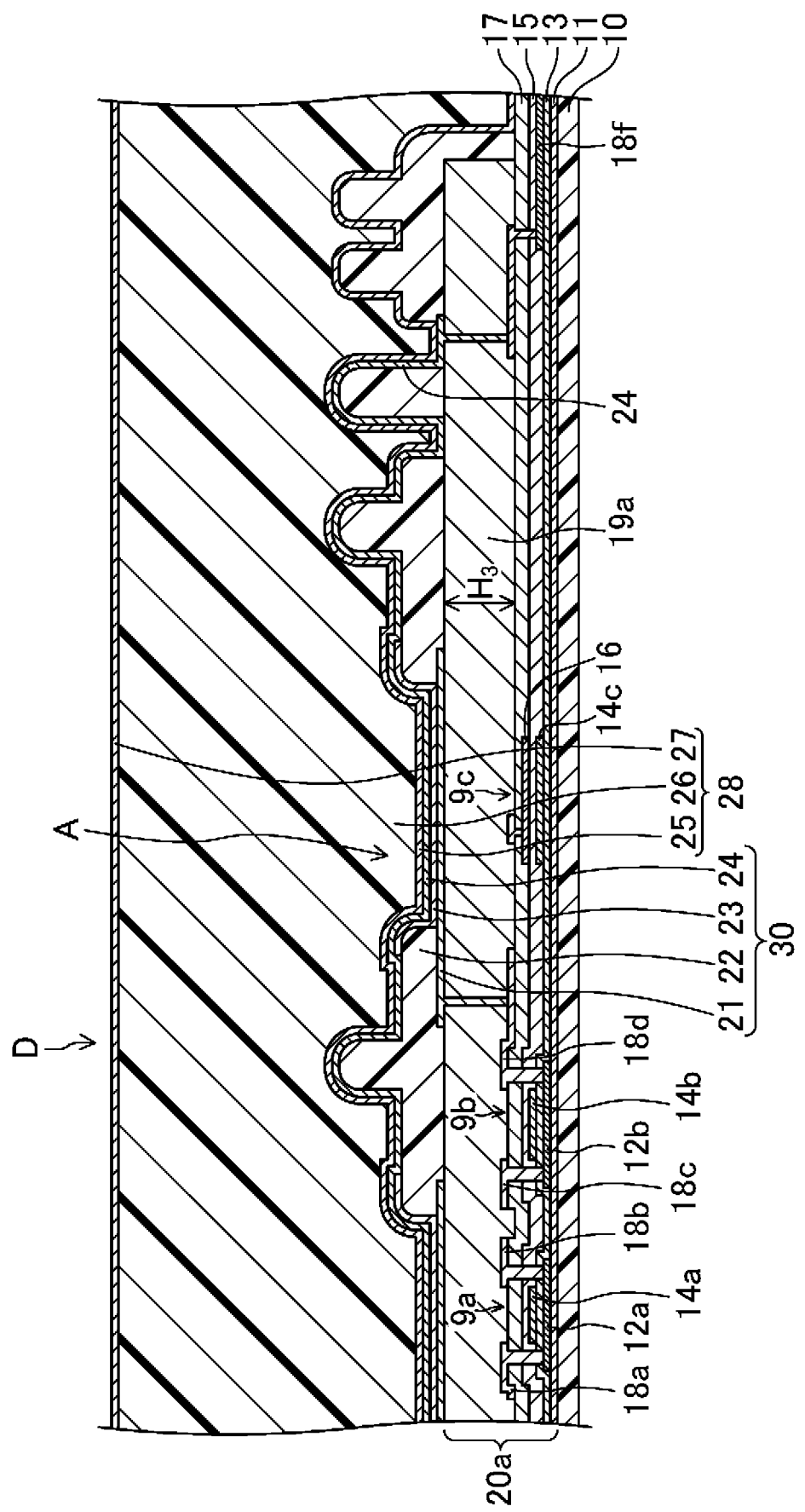
FIG. 4 is a cross-sectional view of the display region of the organic EL display device according to the first embodiment.
Figure 5:
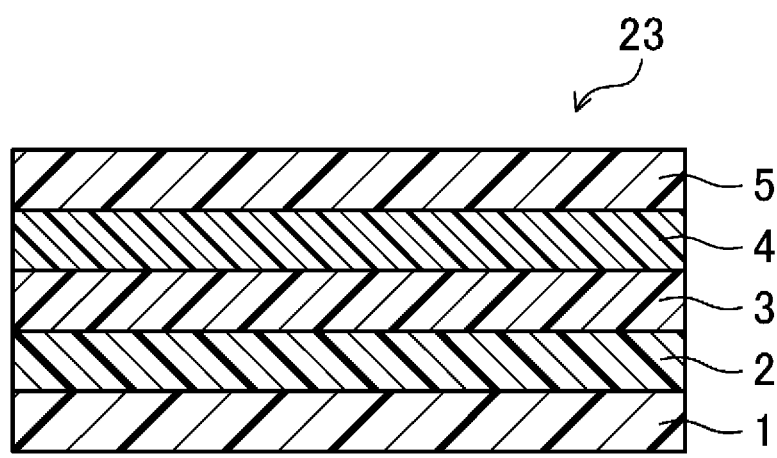
FIG. 5 is a cross-sectional view illustrating an organic EL layer constituting the organic EL display device according to the first embodiment.

FIGS. 1 to 5 illustrate a first embodiment of a display device according to the disclosure. Note that, in each of the following embodiments, an organic EL display device including an organic EL element will be described as a display device including a light-emitting element. Here, FIG. 1 is a plan view of an organic EL display device 50 of the present embodiment. In addition, FIG. 2 is a plan view of a display region D of the organic EL display device 50. In addition, FIG. 3 is an equivalent circuit diagram illustrating a TFT layer 20a constituting the organic EL display device 50. In addition, FIG. 4 is a cross-sectional view of the display region D of the organic EL display device 50. FIG. 5 is a cross-sectional view illustrating an organic EL layer 23 constituting the organic EL display device 50.

As illustrated in FIG. 1, the organic EL display device 50 includes the display region D configured to display an image and defined in a substantially circular shape and a first frame region $F_1$ provided around the display region D and defined in a substantially circular shape similarly to the display region D. In addition, the organic EL display device 50 includes a second frame region $F_2$ that is provided adjacent to the first frame region $F_1$ as illustrated in FIG. 1.

Here, the display region D of the organic EL display device 50 has an organic EL element 30, as illustrated in FIG. 4, in which a plurality of pixels are arranged in a matrix shape. In addition, a terminal portion T is provided at the right end portion of the second frame region $F_2$ in the figure as illustrated in FIG. 1. Further, in the second frame region $F_2$, a bending portion G that is bendable by 180 degrees (in a U shape) about a bending axis in the vertical direction of the drawing is provided between the display region D and the terminal portion T as illustrated in FIG. 1.

In addition, in the organic EL display device 50, a distance $W_1$ between an arc H of the first frame region $F_1$ on the bending portion G side and the bending portion G in a longitudinal direction N of the organic EL display device 50 is configured to vary in a short-hand direction M of the organic EL display device 50 as illustrated in FIG. 1.

A plurality of subpixels P are disposed in a matrix shape in the display region D of the organic EL display device 50 as illustrated in FIG. 2. In addition, in the display region D of the organic EL display device 50, a subpixel P having a red light-emitting region Lr configured to display gradation of red, a subpixel P having a green light-emitting region Lg configured to display gradation of green, and a subpixel P having a blue light-emitting region Lb configured to display gradation of blue are provided adjacent to one another as illustrated in FIG. 2.

Note that one pixel is constituted by three adjacent subpixels P having the red light-emitting region Lr, the green light-emitting region Lg, and the blue light-emitting region Lb in the display region D of the organic EL display device 50.

The organic EL display device 50 includes a resin substrate layer 10 and an organic EL element 30 provided on the resin substrate layer 10 with a thin film transistor (TFT) layer 20a interposed therebetween to constitute the display region D as illustrated in FIG. 4.

The resin substrate layer 10 is formed of, for example, a polyimide resin or the like and is provided as a resin substrate.

As illustrated in FIG. 4, the TFT layer 20a includes a base coat film 11 provided on the resin substrate layer 10, a plurality of first TFTs 9a, a plurality of second TFTs 9b, and a plurality of capacitors 9c provided on the base coat film 11, and a flattening film 19a provided on each of the first TFTs 9a, each of the second TFTs 9b, and each of the capacitors 9c.

Here, as illustrated in FIGS. 2 and 3, in the TFT layer 20a, a plurality of gate lines 14 are provided as metal layers to extend parallel to each other in the horizontal direction in the drawings. In addition, as illustrated in FIGS. 2 and 3, in the TFT layer 20a, a plurality of source lines 18f are provided as metal layers to extend parallel to each other in the vertical direction in the drawings. In addition, as illustrated in FIGS. 2 and 3, in the TFT layer 20a, a plurality of power source lines 18g are provided as metal layers to extend parallel to each other in the vertical direction in the drawings while being adjacent to the corresponding source lines 18f. In addition, as illustrated in FIG. 3, in the TFT layer 20a, each subpixel P includes a first TFT 9a, a second TFT 9b, and a capacitor 9c.

The base coat film 11 is constituted by a single-layer film or a layered film of an inorganic insulating film of, for example, silicon nitride, silicon oxide, silicon oxynitride, or the like.

The first TFT 9a is connected to a corresponding gate line 14 and source line 18f in each subpixel P as illustrated in FIG. 3. Here, as illustrated in FIG. 4, the first TFT 9a includes a semiconductor layer 12a provided in an island shape on the base coat film 11, a gate insulating film 13 provided to cover the semiconductor layer 12a, a gate electrode 14a provided on the gate insulating film 13 to overlap part of the semiconductor layer 12a, a first interlayer insulating film 15 and a second interlayer insulating film 17 which are sequentially provided to cover the gate electrode 14a, and a source electrode 18a and a drain electrode 18b which are provided on the second interlayer insulating film 17 disposed to be spaced apart from each other.

Note that the gate insulating film 13, the first interlayer insulating film 15, and the second interlayer insulating film 17 are constituted by a single-layer film or a layered film of an inorganic insulating film of, for example, silicon nitride, silicon oxide, silicon oxynitride, or the like.

The second TFT 9b is connected to the corresponding first TFT 9a and power source line 18g in each subpixel P as illustrated in FIG. 3. Here, as illustrated in FIG. 4, the second TFT 9b includes a semiconductor layer 12b provided in an island shape on the base coat film 11, a gate insulating film 13 provided to cover the semiconductor layer 12b, a gate electrode 14b provided on the gate insulating film 13 to overlap part of the semiconductor layer 12b, the first interlayer insulating film 15 and the second interlayer insulating film 17 that are sequentially provided to cover the gate electrode 14b, and a source electrode 18c and a drain electrode 18d that are provided on the second interlayer insulating film 17 disposed to be spaced apart from each other.

Note that, although the first TFT 9a and the second TFT 9b are described as of a top-gate type in the present embodiment, the first TFT 9a and the second TFT 9b may be bottom-gate type TFTs.

The capacitor 9c is connected to the corresponding first TFT 9a and power source line 18g in each subpixel P as illustrated in FIG. 3. Here, the capacitor 9c includes a lower conductive layer 14c formed of the same material and in the same layer as those of the gate electrode, the first interlayer insulating film 15 provided to cover the lower conductive layer 14c, and an upper conductive layer 16 provided on the first interlayer insulating film 15 to overlap the lower conductive layer 14c as illustrated in FIG. 4.

In addition, in the present embodiment, the flattening film 19a is formed of an inexpensive organic resin material such as an acrylic resin or an epoxy resin. Note that the flattening film 19a may be formed of a polyimide resin.

As illustrated in FIG. 4, the organic EL element 30 includes a plurality of first electrodes (reflective electrodes) 21, a plurality of second electrodes (transparent electrodes) 24 provided to be opposed to the first electrodes 21, a plurality of organic EL layers 23 each provided between the first electrode 21 and the second electrode 24, and a plurality of edge covers 22, which are provided in order on the flattening film 19a.

The plurality of first electrodes 21 each function as a reflective electrode configured to reflect light emitted from the organic EL layer (light-emitting layer), and are provided in a matrix shape as reflective electrodes on the flattening film 19a to correspond to the plurality of subpixels P as illustrated in FIG. 4. Here, the first electrode 21 is connected to a drain electrode 18d of each second TFT 9b via a contact hole formed in the flattening film 19a as illustrated in FIG. 4. In addition, the first electrode 21 has a function of injecting holes (positive holes) into the organic EL layer 23. In addition, the first electrode 21 is preferably formed of a material having a large work function to improve the efficiency of hole injection into the organic EL layer 23. Here, examples of materials constituting the first electrode 21 include metallic materials, for example, silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), lithium fluoride (LiF), and the like. In addition, a material constituting the first electrode 21 may be an alloy of, for example, magnesium (Mg)/copper (Cu), magnesium (Mg)/silver (Ag), sodium (Na)/potassium (K), astatine (At)/astatine oxide ($AtO_2$), lithium (Li)/aluminum (Al), lithium (Li)/calcium (Ca)/aluminum (Al), lithium fluoride (LiF)/calcium (Ca)/aluminum (Al), or the like. Furthermore, a material constituting the first electrode 21 may be a conductive oxide, for example, tin oxide (SnO), zinc oxide (ZnO), indium tin oxide (ITO), and indium zinc oxide (IZO). In addition, the first electrode 21 may be formed by layering a plurality of layers formed of any of the materials described above. Note that, examples of materials having a large work function include indium tin oxide (ITO) and indium zinc oxide (IZO).

The edge covers 22 are provided in a lattice pattern on the TFT layer 20a to cover a peripheral portion of each first electrode 21 as illustrated in FIG. 4. The edge cover 22 is provided between each of the light-emitting regions Lr, Lg and Lb, and functions as a partition for partitioning each of the light-emitting regions Lr, Lg, and Lb.

Here, examples of a material constituting the edge cover 22 include an organic resin material of, for example, a polyimide resin, a spin-on glass (SOG) resin, or the like.

The plurality of organic EL layers 23 are disposed on each of the first electrodes 21 as illustrated in FIG. 4 and are provided in a matrix shape to correspond to the plurality of subpixels. Here, each organic EL layer 23 includes a hole injection layer 1, a hole transport layer 2, a light-emitting layer 3, an electron transport layer 4, and an electron injection layer 5 which are provided sequentially on the first electrode 21 as illustrated in FIG. 5.

The hole injection layer 1 is also referred to as an anode electrode buffer layer, and functions to reduce an energy level difference between the first electrode 21 and the organic EL layer 23 to thereby improve the efficiency of hole injection into the organic EL layer 23 from the first electrode 21. Here, examples of materials constituting the hole injection layer 1 include, for example, triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, stilbene derivatives, and the like.

The hole transport layer 2 functions to improve the efficiency of hole transport from the first electrode 21 to the organic EL layer 23. Here, examples of materials constituting the hole transport layer 2 include, for example, porphyrin derivatives, aromatic tertiary amine compounds, styrylamine derivatives, polyvinylcarbazole, poly-p-phenylenevinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, zinc selenide, and the like.

The light-emitting layer 3 is a region in which holes and electrons are injected from the first electrode 21 and the second electrode 24, respectively, and the holes and the electrons recombine, when a voltage is applied via the first electrode 21 and the second electrode 24. Here, the light-emitting layer 3 is formed of a material having high luminous efficiency. In addition, examples of materials constituting the light-emitting layer 3 include, for example, metal oxinoid compounds (8-hydroxyquinoline metal complexes), naphthalene derivatives, anthracene derivatives, diphenyl ethylene derivatives, vinyl acetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, tris-styrylbenzene derivatives, perylene derivatives, perinone derivatives, aminopyrene derivatives, pyridine derivatives, rhodamine derivatives, aquidine derivatives, phenoxazone, quinacridone derivatives, rubrene, poly-p-phenylenevinylene, polysilane, and the like.

The electron transport layer 4 functions to facilitate migration of electrons to the light-emitting layer 3 efficiently. Here, examples of materials constituting the electron transport layer 4 include, for example, oxadiazole derivatives, triazole derivatives, benzoquinone derivatives, naphthoquinone derivatives, anthraquinone derivatives, tetracyanoanthraquinodimethane derivatives, diphenoquinone derivatives, fluorenone derivatives, silole derivatives, metal oxinoid compounds, and the like as organic compounds.

The electron injection layer 5 functions to reduce an energy level difference between the second electrode 24 and the organic EL layer 23 to thereby improve the efficiency of electron injection into the organic EL layer 23 from the second electrode 24, and thus can lower a drive voltage of the organic EL element 30. Note that the electron injection layer 5 is also referred to as a cathode electrode buffer layer. Here, examples of materials constituting the electron injection layer 5 include, for example, inorganic alkaline compounds such as lithium fluoride (LiF), magnesium fluoride ($MgF_2$), calcium fluoride ($CaF_2$), strontium fluoride ($SrF_2$), and barium fluoride ($BaF_2$), aluminum oxide ($Al_2O_3$), strontium oxide (SrO), and the like.

As illustrated in FIG. 4, the second electrode 24 is provided to cover each of the organic EL layer 23 and the edge cover 22. In addition, the second electrode 24 functions to inject electrons into the organic EL layer 23. The second electrode 24 is preferably formed of a material having a small work function to improve the efficiency of electron injection into the organic EL layer 23. Here, examples of materials constituting the second electrode 24 include, for example, silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), lithium fluoride (LiF), and the like. In addition, the second electrode 24 may be formed of an alloy of, for example, magnesium (Mg)/copper (Cu), magnesium (Mg)/silver (Ag), sodium (Na)/potassium (K), astatine (At)/astatine oxide ($AtO_2$), lithium (Li)/aluminum (Al), lithium (Li)/calcium (Ca)/aluminum (Al), lithium fluoride (LiF)/calcium (Ca)/aluminum (Al), and the like. In addition, the second electrode 24 may be formed of an electrically conductive oxide, for example, tin oxide (SnO), zinc oxide (ZnO), indium tin oxide (ITO), indium zinc oxide (IZO), and the like. In addition, the second electrode 24 may be formed by layering a plurality of layers formed of any of the materials described above. Note that, examples of materials having a small work function include, for example, magnesium (Mg), lithium (Li), lithium fluoride (LiF), magnesium (Mg)/copper (Cu), magnesium (Mg)/silver (Ag), sodium (Na)/potassium (K), lithium (Li)/aluminum (Al), lithium (Li)/calcium (Ca)/aluminum (Al), lithium fluoride (LiF)/calcium (Ca)/aluminum (Al), and the like.

In addition, as illustrated in FIG. 4, the organic EL display device 50 includes a sealing film 28 which covers the organic EL element 30. The sealing film 28 includes a first inorganic film 25 provided to cover the second electrode 24, an organic film 26 provided to cover the first inorganic film 25, and a second inorganic film 27 provided to cover the organic film 26, and functions to protect the organic EL layer 23 from moisture or oxygen.

The first inorganic film 25 and the second inorganic film 27 are formed of an inorganic material, for example, silicon oxide ($SiO_2$), aluminum oxide ($Al_2O_3$), silicon nitrides (SiNx (x is a positive number)) such as trisilicon tetranitride ($Si_3N_4$), silicon carbonitride (SiCN), or the like. In addition, the organic film 26 is formed of an organic material, for example, acrylate, polyurea, parylene, polyimide, polyamide, or the like.

The organic EL display device 50 described above is configured to display an image by, in each subpixel P, inputting a gate signal into the first TFT 9a via the gate line 14 to thereby turn on the first TFT 9a, writing a predetermined voltage corresponding to a source signal in the gate electrode 14b of the second TFT 9b and the capacitor 9c via the source line 18f, specifying the magnitude of the current from the power source line 18g based on a gate voltage of the second TFT 9b, and supplying the specified current to the organic EL layer 23, and thus causing the light-emitting layer 3 of the organic EL layer 23 to emit light.

Note that, in the organic EL display device 50, because even when the first TFT 9a is turned off, the gate voltage of the second TFT 9b is held by the capacitor 9c, the light-emitting layer 3 is kept emitting light until a gate signal of the next frame is input.

The organic EL display device 50 of the present embodiment can be manufactured, for example, by forming the TFT layer 20a and the organic EL element 30 on a surface of the resin substrate layer 10 formed on the glass substrate by use of a known method, and then separating the glass substrate from the resin substrate layer 10.

Figure 6:
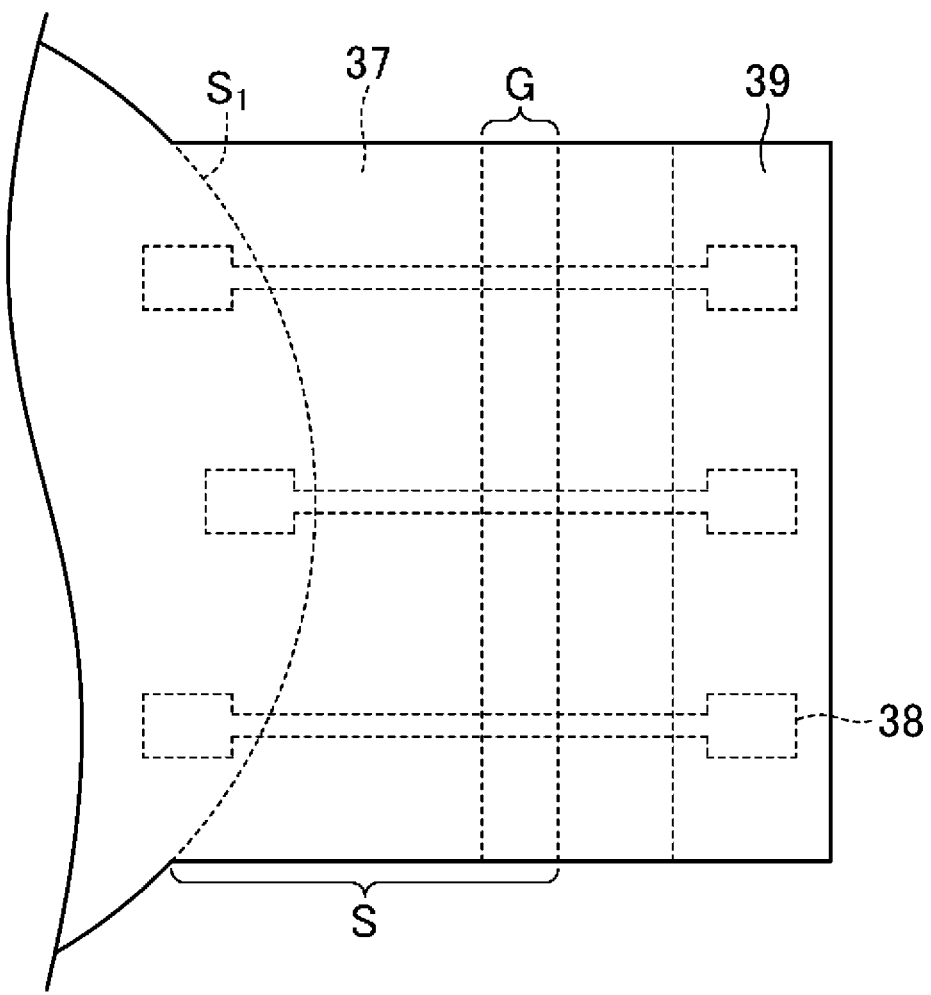
FIG. 6 is a plan view of a bending portion of the organic EL display device according to the first embodiment.
Figure 7:
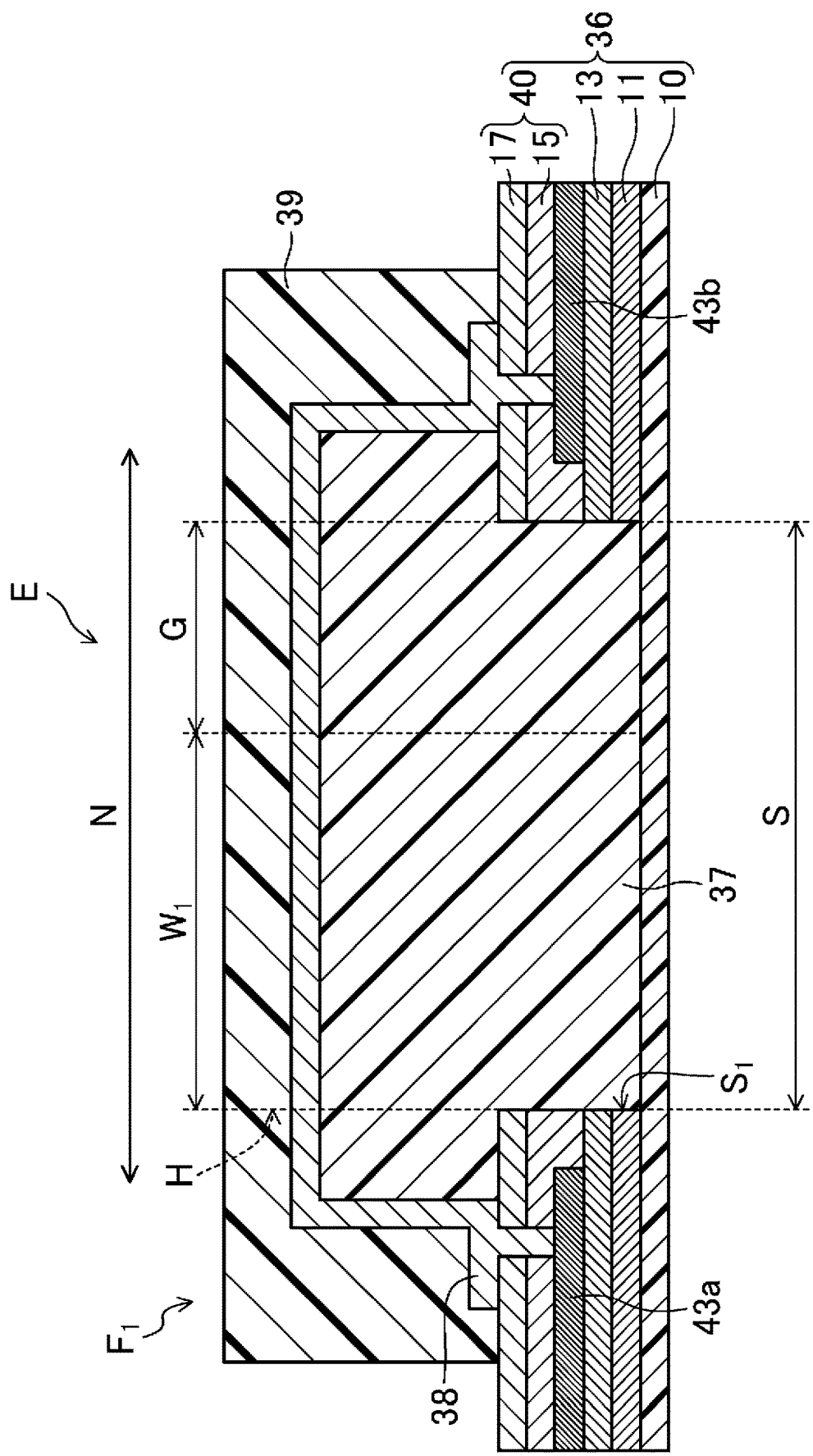
FIG. 7 is a cross-sectional view of the bending portion of the organic EL display device according to the first embodiment and an A-A cross-sectional view of FIG. 1.
Figure 8:
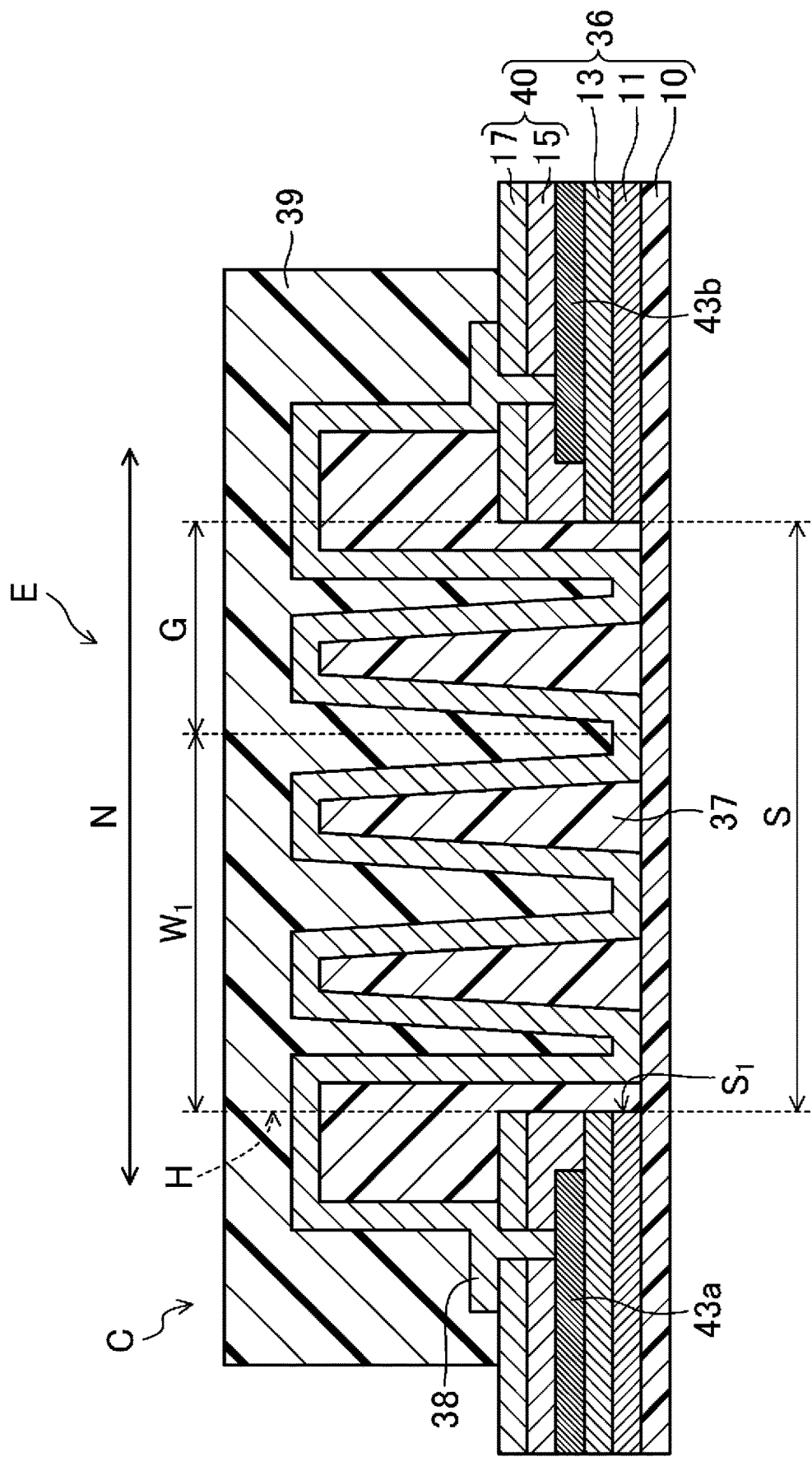
FIG. 8 is a cross-sectional view of the bending portion of the organic EL display device according to the first embodiment and a B-B cross-sectional view of FIG. 1.

Next, the bending portion of the present embodiment will be described. FIG. 6 is a plan view of the bending portion G of the organic EL display device 50 according to the present embodiment. FIG. 7 is a cross-sectional view of the bending portion G of the organic EL display device 50 according to the present embodiment and an A-A cross-sectional view of FIG. 1. In addition, FIG. 8 is a cross-sectional view of the central portion of the bending portion G of the organic EL display device 50 according to the present embodiment and a B-B cross-sectional view of FIG. 1.

As illustrated in FIGS. 6 and 7, the organic EL display device 50 includes, in a bending region E of the second frame region $F_2$, the resin substrate layer 10, an inorganic layered film 36 and a frame flattening film 37 provided on a surface of the resin substrate layer 10, a plurality of frame wiring lines 38 provided on a surface of the frame flattening film 37 to connect gate conductive layers 43a and 43b to each other, and a surface protection layer 39 provided to cover the frame wiring lines 38.

The gate conductive layer 43a is electrically connected to signal wiring lines (the gate line 14, source line 18f, power source line 18g, and the like) provided in the TFT layer 20a in the display region D, and is provided to extend toward the display region D side. In addition, the gate conductive layer 43b is provided to extend to the terminal portion T.

The plurality of frame wiring lines 38 are electrically connected to the signal wiring lines (source line 18f) in the display region D and are provided on the frame flattening film 37 across an opening S, and the surface protection layer 39 is configured to cover the frame wiring lines 38, as illustrated in FIGS. 6 and 7. Accordingly, the frame wiring lines 38 are protected by the surface protection layer 39.

In addition, as illustrated in FIG. 1, the opening S is open from one end portion to the other end portion of the second frame region $F_2$ along the bending portion G, and as illustrated in FIGS. 1 and 7, the frame flattening film 37 is provided in a belt shape to cover the opening S and the end portion of the inorganic layered film 36 on the opening S side.

The inorganic layered film 36 is at least a one-layer inorganic layer constituting the TFT layer 20a, and includes the base coat film 11, the gate insulating film 13, and an interlayer insulating film 40 formed of the first interlayer insulating film 15 and the second interlayer insulating film 17, which are sequentially layered on the resin substrate layer 10 as illustrated in FIG. 7. Note that the inorganic layered film 36 is also provided in the first frame region $F_1$.

The gate conductive layers 43a and 43b are provided between the gate insulating film 13 and the interlayer insulating film 40 constituting the inorganic layered film 36.

In addition, the base coat film 11, the gate insulating film 13, and the interlayer insulating film 40 of the inorganic layered film 36 are not provided in the bending portion G, the opening S is formed in the inorganic layered film 36, and the frame flattening film 37 is configured to cover (fill) the opening S as illustrated in FIG. 7.

Furthermore, the bending portion G provided with the frame flattening film 37, the frame wiring line 38, and the surface protection layer 39 is configured to be bendable at an angle of up to 180 degrees.

Here, in the present embodiment, the end portion $S_1$ of the opening S on the display region D side is formed along the arc H of the first frame region $F_1$ on the opening S side as illustrated in FIGS. 1 and 7.

Thus, because the inorganic layered film 36 between the bending portion G and the first frame region $F_1$ is removed, the disadvantage of cracks occurring during bending in the inorganic film between the bending portion G and the first frame region $F_1$ can be prevented.

In addition, a width $W_1$ of the opening S is configured to gradually increase from the central portion to the end portion of the opening S in a direction M (i.e., the short-hand direction of the organic EL display device 50) that is orthogonal to the direction N (i.e., the longitudinal direction of the organic EL display device 50) in which the frame wiring lines 38 extend as illustrated in FIGS. 1 and 7.

In addition, in the direction M of the opening S that is orthogonal to the direction N in which the frame wiring lines 38 extend, at least one of the frame wiring lines 38 is provided along a surface of the frame flattening film 37 having no unevenness as illustrated in FIG. 7.

In addition, as illustrated in FIG. 8, the frame flattening film 37 at the center portion C of the opening S has an uneven shape, the frame wiring line 38 is provided along the surface of the uneven shape, and a part of the frame wiring line 38 in the opening S is in contact with the resin substrate layer 10.

Note that, although slits are formed in the frame flattening film 37, and portions of the frame wiring lines 38 and the resin substrate layer 10 are in contact with each other in a cross section in FIG. 8, the frame wiring lines 38 may be formed on a surface of unevenness without coming in contact with the resin substrate layer 10, the unevenness with no slit formed in the frame flattening film 37.

Thus, originally in the central portion C of the opening S in which a wiring length of the frame wiring lines 38 is shortened, it is possible to set the wiring length of the frame wiring lines 38 to a length equivalent to a wiring length of the frame wiring line (e.g., the frame wiring lines 38 illustrated in FIG. 7) provided in a region other than the central portion C. As a result, variations in resistance values among the wiring lines of the plurality of frame wiring lines 38 can be suppressed.

As discussed above, according to the organic EL display device 50 of the present embodiment, the following effects can be obtained.

(1) The end portion $S_1$ of the opening S on the display region D side is formed along the arc H of the first frame region $F_1$ on the bending portion G side. Thus, the disadvantage of cracks occurring during bending in the inorganic film between the bending portion G and the first frame region $F_1$ can be prevented.

(2) The frame flattening film 37 at the central portion C of the opening S has an uneven shape, and the frame wiring lines 38 are provided along the surface of the uneven shape. Thus, variations in resistance values among the wiring lines of the plurality of frame wiring lines 38 can be suppressed.

Second Embodiment

Figure 9:
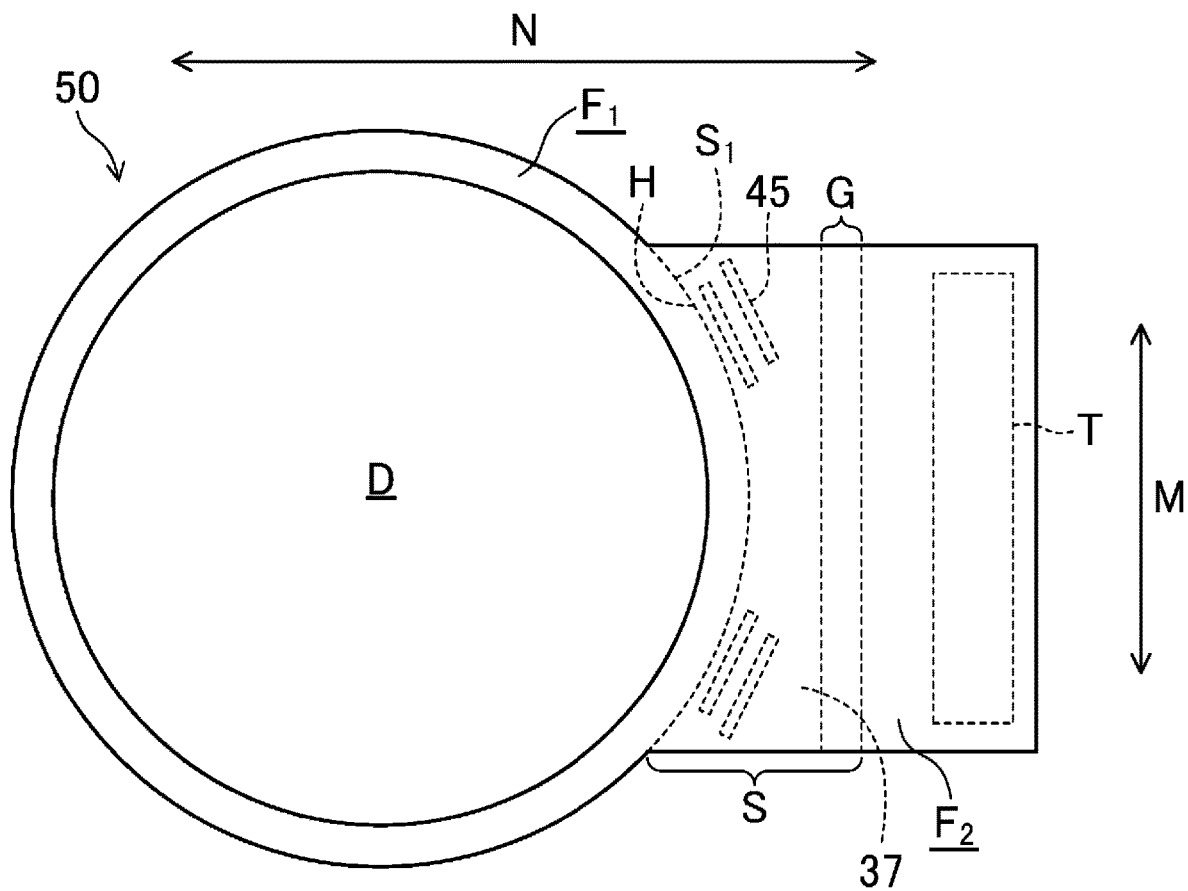
FIG. 9 is a plan view of an organic EL display device according to a second embodiment.

Next, a second embodiment of the disclosure will be described. FIG. 9 is a plan view of an organic EL display device according to the present embodiment. Note that the entire configuration of the organic EL display device including a display region D and a bending region E is the same as that of the first embodiment described above, and detailed description thereof will be omitted. In addition, constituent portions similar to those in the first embodiment are denoted by the same reference signs, and thus description thereof will be omitted.

As illustrated in FIG. 9, in the present embodiment, a plurality of ribs (four ribs in FIG. 9) 45 formed of the inorganic layered film 36 described above are provided in an opening S.

Additionally, each of the ribs 45 is provided along an end portion $S_1$ of the opening S on the display region D side as illustrated in FIG. 9.

The organic EL display device 50 of the present embodiment described above is able to exhibit the following effect in addition to the above-discussed effects (1) and (2).

(3) The ribs 45 are provided along the end portions $S_1$ of the opening S on the display region D side. Thus, because the ribs 45 assist with bending at the time of bending, the bending at the bending portion G becomes easier even in a case in which the end portion $S_1$ of the opening S on the display region D side is formed along an arc H of the first frame region $F_1$ on the opening S side.

Other Configurations

Figure 10:
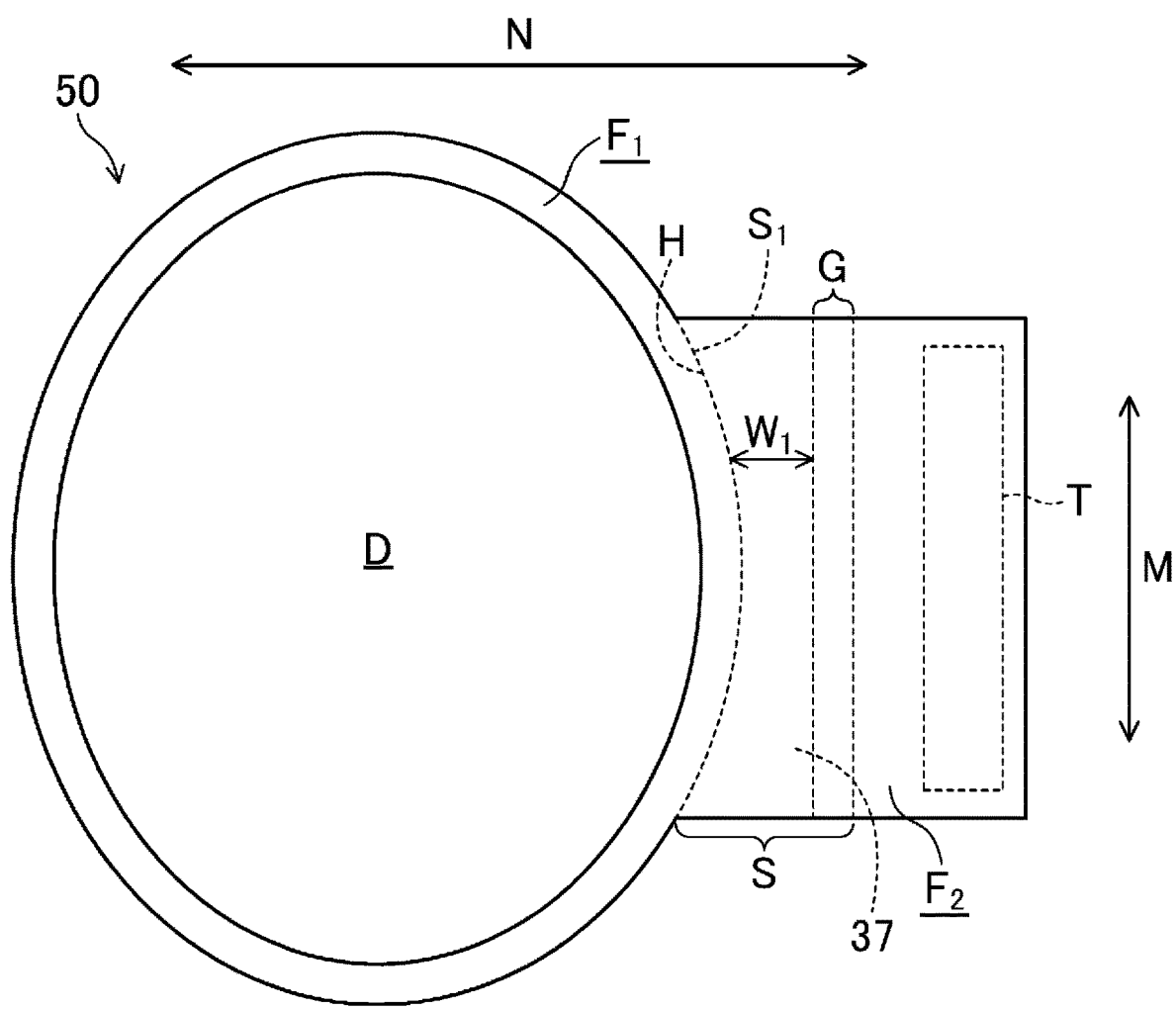
FIG. 10 is a plan view of an organic EL display device according to a modified example.

Although the organic EL display device 50 having the display region D and the first frame region $F_1$ defined in a substantially circular shape has been described as an example of the display device of the disclosure in the above-described embodiments, the display region D and the first frame region $F_1$ of the organic EL display device 50 may be defined in a substantially oval shape as illustrated in FIG. 10. In such a configuration, the same effects as those of (1) to (3) described above can be obtained.

Figure 11:
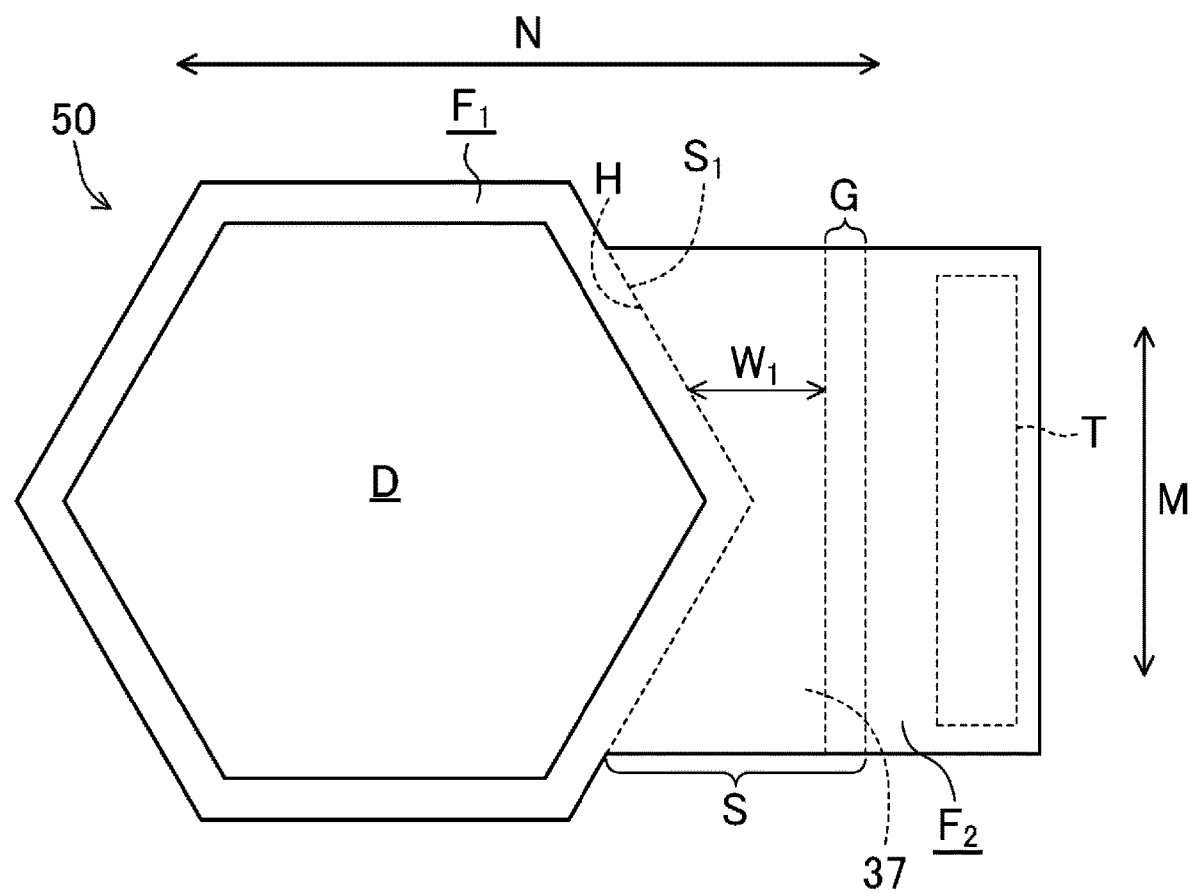
FIG. 11 is a plan view of an organic EL display device according to a modified example.

In addition, in the display device according to the disclosure, the display region D and the first frame region $F_1$ may be defined in a polygonal shape (hexagonal shape in FIG. 10), and a distance $W_1$ between an end portion (corresponding to the arc of FIG. 1) H of the first frame region $F_1$ on the bending portion G side and the bending portion G in the longitudinal direction N of the organic EL display device 50 may vary in the short-hand direction M of the organic EL display device 50, and similar to the first embodiment described above, the end portion $S_1$ of the opening S on the display region D side may be formed along the end portion H of the first frame region $F_1$ on the bending portion G side as illustrated in FIG. 11. In such a configuration, the same effects to those of (1) to (3) described above can be obtained.

Figure 12:
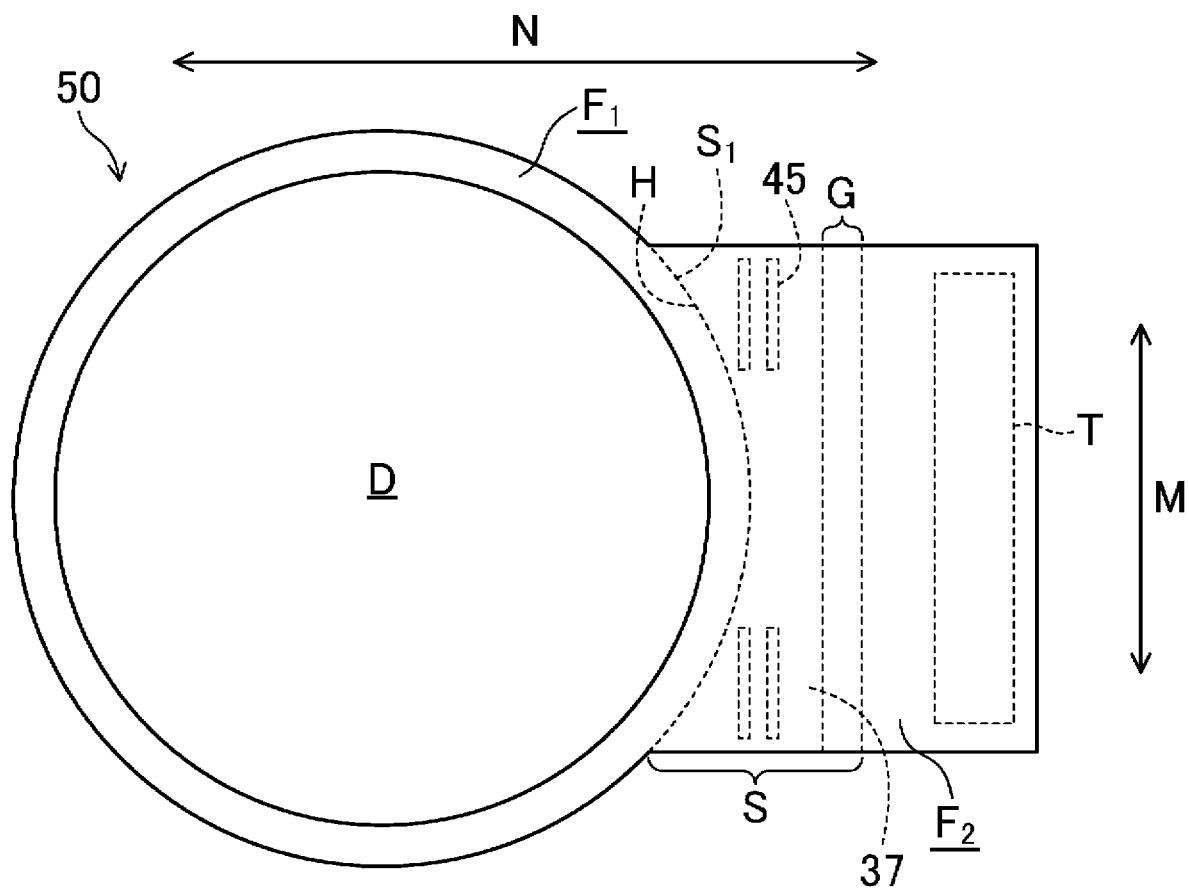
FIG. 12 is a plan view of an organic EL display device according to a modified example.

In addition, the ribs 45 may be provided along the bending portion G as illustrated in FIG. 12. With such a configuration, bending at the bending portion G becomes easier.

Figure 13:
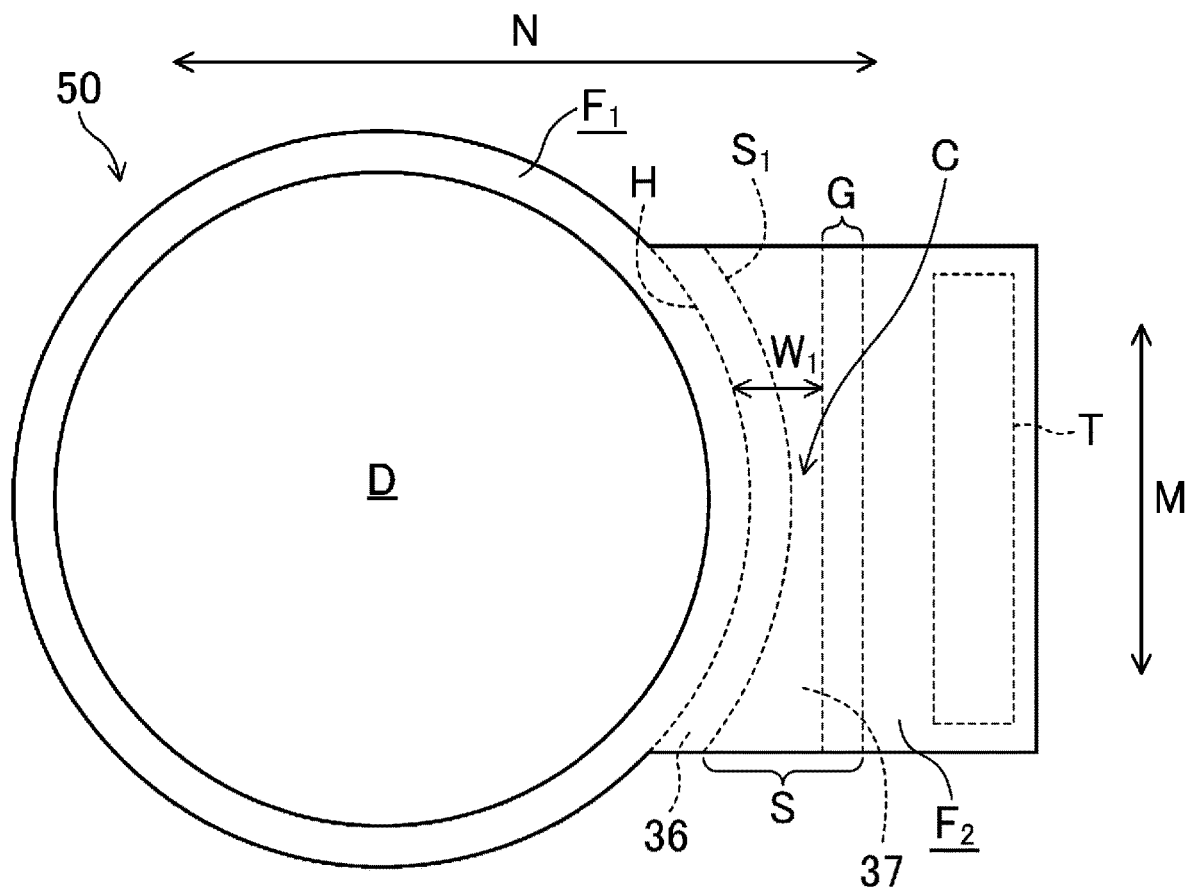
FIG. 13 is a plan view of an organic EL display device according to a modified example.

Further, in the display device of the disclosure, if the end portion $S_1$ of the opening S on the display region D side is formed along the arc H of the first frame region $F_1$ on the bending portion G side, a load on the inorganic film located near the bending portion G is uniform. Thus, as illustrated in FIG. 13, for example, the inorganic layered film 36 may be left between the end portion $S_1$ of the opening S on the display region D side and the arc H of the first frame region $F_1$ on the bending portion G side. In such a configuration, the same effects as those of (1) to (3) described above can be obtained.

Note that it is a matter of course that the configurations of FIGS. 12 and 13 described above can be adopted for the organic EL display device 50 illustrated in FIGS. 10 and 11.

Although the organic EL layer in the five-layer structure including the hole injection layer, the hole transport layer, the light-emitting layer, the electron transport layer, and the electron injection layer has been exemplified in the organic EL display device 50 of the embodiments described above, the organic EL layer may have, for example, a three-layer structure including a hole injection-cum-transport layer, a light-emitting layer, and an electron transport-cum-injection layer.

In addition, although the organic EL display device including the first electrode as an anode electrode and the second electrode as a cathode electrode has been exemplified in each of the embodiments described above, the disclosure is also applicable to an organic EL display device having the reversed layered structure of the organic EL layer with the first electrode being a cathode electrode and the second electrode being an anode electrode.

In addition, although the organic EL display device in which the electrode of the TFT connected to the first electrode serves as the source electrode has been exemplified in each of the above-described embodiments, the disclosure is also applicable to an organic EL display device of which an electrode of the TFT connected to the first electrode is called a drain electrode.

In addition, although the organic EL display device has been exemplified as a display device in each of the above embodiments, the disclosure is applicable to a display device including a plurality of current-driven light-emitting elements, for example, a display device including a quantum dot light-emitting diode (QLED), which is a light-emitting element using a quantum dot-containing layer.

INDUSTRIAL APPLICABILITY

As described thus far, the disclosure is useful for display devices such as an organic EL display device.

The invention claimed is:
1. A display device comprising:
a resin substrate;
a thin film transistor (TFT) layer provided on the resin substrate and including a flattening film;
a light-emitting element provided via the TFT layer to constitute a display region;
a first frame region provided around the display region;
a second frame region provided adjacent to the first frame region;
a terminal portion provided at an end portion of the second frame region;
a bending portion provided between the display region and the terminal portion in the second frame region;
a plurality of frame wiring lines that are provided in the second frame region, are connected to a wiring line of the display region, and extend to the terminal portion; and
an at least one-layer inorganic film provided in the second frame region to constitute the TFT layer layered on the resin substrate,
wherein the display region and the first frame region are defined in a substantially circular shape or a substantially oval shape,
in the bending portion and a region between the bending portion and the first frame region, an opening is formed in the at least one-layer inorganic film and a frame flattening film is provided to fill the opening, and
an end portion of the opening on the display region side is formed along an arc of the first frame region on the bending portion side.

2. The display device according to claim 1,
wherein the plurality of frame wiring lines are provided on the frame flattening film to cross the opening,
a width of the opening gradually increases from a central portion to an end portion of the opening in a direction orthogonal to a direction in which the plurality of frame wiring lines extend,
the frame flattening film at the central portion has an uneven shape, and
the frame wiring lines are provided along a surface of the uneven shape.

3. The display device according to claim 2,
wherein some of the plurality of frame wiring lines in the opening are in contact with the resin substrate.

4. The display device according to claim 2,
wherein at least one of the plurality of frame wiring lines is provided along a surface of the frame flattening film without an uneven shape at an end portion of the opening in the direction orthogonal to the direction in which the plurality of frame wiring lines extend.

5. The display device according to claim 1,
wherein a plurality of ribs formed of the at least one-layer inorganic film are provided in the opening.

6. The display device according to claim 5,
wherein the plurality of ribs are provided to extend along the end portion of the opening on the display region side.

7. The display device according to claim 5,
wherein the plurality of ribs are provided to extend along a direction orthogonal to a direction in which the plurality of frame wiring lines extend.

8. The display device according to claim 1,
wherein the light-emitting element is an organic electroluminescence (EL) element.

9. The display device according to claim 1,
wherein, in a direction orthogonal to a direction in which the plurality of frame wiring lines extend, a width of the second frame region is equal to a width of the region between the bending portion and the first frame region in the opening.

10. The display device according to claim 1,
wherein the plurality of frame wiring lines are provided on the frame flattening film to cross the opening,
the frame flattening film has a concave portion and a convex portion forming an uneven shape, the concave portion and the convex portion are arranged along the direction in which the plurality of frame wiring lines extend, and the plurality of frame wiring lines are provided along a surface of the concave portion and the convex portion.

11. A display device comprising:
a resin substrate;
a TFT layer provided on the resin substrate and including a flattening film;

a light-emitting element provided via the TFT layer to constitute a display region;

a first frame region provided around the display region;

a second frame region provided adjacent to the first frame region;

a terminal portion provided at an end portion of the second frame region;

a bending portion provided between the display region and the terminal portion in the second frame region;

a plurality of frame wiring lines that are provided in the second frame region, are connected to a wiring line of the display region, and extend to the terminal portion; and an at least one-layer inorganic film provided in the second frame region to constitute the TFT layer layered on the resin substrate, wherein the display region and the first frame region are defined in a polygonal shape, a distance between an end portion of the first frame region on the bending portion side and the bending portion in a longitudinal direction of the display device varies in a short-hand direction of the display device, in the bending portion and a region between the bending portion and the first frame region, an opening is formed in the at least one-layer inorganic film and a frame flattening film is provided to fill the opening, and an end portion of the opening on the display region side is formed along the end portion of the first frame region on the bending portion side.

12. The display device according to claim 11, wherein the plurality of frame wiring lines are provided on the frame flattening film to cross the opening, a width of the opening gradually increases from a central portion to an end portion of the opening in a direction orthogonal to a direction in which the plurality of frame wiring lines extend, an uneven portion is formed on the frame flattening film at the central portion, and the plurality of frame wiring lines are provided along a surface of the uneven portion.

13. The display device according to claim 12, wherein some of the plurality of frame wiring lines in the opening are in contact with the resin substrate.

14. The display device according to claim 12, wherein at least one of the plurality of frame wiring lines is provided along a surface of the frame flattening film without an uneven shape at an end portion of the opening in the direction orthogonal to the direction in which the plurality of frame wiring lines extend.

15. The display device according to claim 11, wherein a plurality of ribs formed of the at least one-layer inorganic film are provided in the opening.

16. The display device according to claim 15, wherein the plurality of ribs are provided to extend along the end portion of the opening on the display region side.

17. The display device according to claim 15, wherein the plurality of ribs are provided to extend along a direction orthogonal to a direction in which the plurality of frame wiring lines extend.

18. The display device according to claim 11, wherein, in a direction orthogonal to a direction in which the plurality of frame wiring lines extend, a width of the second frame region is equal to a width of the region between the bending portion and the first frame region in the opening.

19. The display device according to claim 11, wherein the plurality of frame wiring lines are provided on the frame flattening film to cross the opening, the frame flattening film has a concave portion and a convex portion forming an uneven shape, the concave portion and the convex portion are arranged along the direction in which the plurality of frame wiring lines extend, and the plurality of frame wiring lines are provided along a surface of the concave portion and the convex portion.

* * * * *